US 6,597,060 B2

(12) United States Patent
Okada et al.

(10) Patent No.: US 6,597,060 B2
(45) Date of Patent: Jul. 22, 2003

(54) SEMICONDUCTOR DEVICE PACKAGE

(75) Inventors: Takahiro Okada, Tokyo (JP); Hideaki Murata, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 09/794,065

(22) Filed: Feb. 28, 2001

(65) Prior Publication Data
US 2001/0030358 A1 Oct. 18, 2001

(30) Foreign Application Priority Data
Mar. 1, 2000 (JP) ......................................... 2000-055604

(51) Int. Cl.$^7$ .............................................. H01L 23/02
(52) U.S. Cl. ....................... 257/678; 257/680; 257/704; 257/710
(58) Field of Search ................................ 257/678, 680, 257/688–692, 698, 704, 707, 708, 710, 728–733; 438/106, 121

(56) References Cited

U.S. PATENT DOCUMENTS

| 4,805,009 A | * | 2/1989 | Pryor et al. ................. 257/729 |
| 5,723,904 A | * | 3/1998 | Shiga ......................... 257/698 |
| 6,257,400 B1 | * | 7/2001 | Woodhouse ................. 206/69 |

* cited by examiner

*Primary Examiner*—Tom Thomas
*Assistant Examiner*—Douglas W. Owens
(74) *Attorney, Agent, or Firm*—Oblon, Spivak, McClelland, Maier & Neustadt, P.C.

(57) ABSTRACT

A semiconductor device package is comprised of a metal base for receiving a semiconductor device, a metal frame joined at its lower face to the metal base, a seal ring joined at its lower face to an upper face of the metal frame, and a metal lid joined to an upper face of the seal ring. The upper face of the seal ring is formed, at its at least two sides facing each other, into a concavely warped shape as viewed in vertical cross section, and the maximum warpage of the upper face of the seal ring is not more than 0.2% of the length of the side of the upper face.

12 Claims, 2 Drawing Sheets

SEMICONDUCTOR DEVICE PACKAGE

BACKGROUND OF THE INVENTION

1. Technical Field

The present invention relates to a semiconductor device package, and more particularly, to a semiconductor device package capable of reducing occurrences of faulty welding of a package base to a lid or a seal ring to be joined thereto.

2. Related Art

A semiconductor device is sealed within a package, so as to be available for use. Typically, a semiconductor device package is comprised of a metal base having a placement section on which a semiconductor device is placed, a metal frame joined to the base, a seal ring joined to an open upper face of the frame, and a metal lid joined to the seal ring. The package is formed into a box-like shape as a whole. To hermetically seal a semiconductor device within such a package, the metal lid is seam-welded to the seal ring after the semiconductor device is received in a package housing formed by the metal base, metal frame and seal ring which are silver-brazed with one another.

In the seam welding, two roller electrodes are positioned individually at one ends of two facing sides of the metal lid, with the metal frame held on the seal ring of the package housing, and the roller electrodes are pressed against the metal lid. Thereafter, the roller electrodes and the package are moved relative to one another until the roller electrodes reach the other ends of the two sides of the metal lid, while a welding current is supplied between the electrodes, whereby the lid is seam-welded at the two sides to the seal ring. Then, the remaining two sides of the lid are seam-welded to the seal ring, thereby sealing the semiconductor device within the package. As for a package not provided with a seal ring, the metal lid is seam-welded to the metal frame.

As described above, a semiconductor device package is formed into a box-like shape as a whole. In other words, the package has four corners. Seam welding of the seal ring or the metal lid to the metal frame is carried out in such a manner that only a plated layer formed in advance on a surface of the seal ring or the metal lid is caused to melt, with a constituent material of the seal ring or the lid unmelted. Therefore, seam welding is advantageous in that it can reduce influences of welding heat upon a semiconductor device received in a package. On the other hand, unstable welding conditions are liable to occur at corners of a package, and in this case, faulty welding may be caused at the corners.

Although occurrences of such faulty welding can be reduced by increasing an amount of power supply to roller electrodes, welding heat increases with increase in the amount of power supply, so that a semiconductor device accommodated in a package may receive thermal affection, causing a misalignment in the semiconductor device. As for an optical semiconductor device and an optical component that are especially required of a high alignment accuracy, a misalignment can occur for such a simple reason that a creep deformation is caused in a silver alloy, with which various portions of an optical semiconductor device are joined to one another. Thus, an increased amount of power supply in seam welding for an optical semiconductor device package may cause a misalignment in an optical semiconductor device or an optical component received therein. This indicates that it is unpractical to increase the power supply amount to eliminate welding failure. Since seam welding for a semiconductor device package is carried out in a final stage of production of semiconductor modules, welding failure entails great damage, and therefore, a reduction of occurrences of faulty welding has been strongly demanded.

SUMMARY OF THE INVENTION

An object of the present invention is to provide a semiconductor device package capable of reducing occurrences of faulty welding, without the need of increasing an amount of power supply for seam welding of a metal base to a metal lid or a seal ring of the package.

According to one aspect of the present invention, there is provided a semiconductor device package comprised of a metal base having a placement section on which a semiconductor device is placed; a metal frame having a rectangular shape in transverse cross section and having a first face thereof joined to the metal base; and a metal lid joined to a second face of the metal frame. In the semiconductor device package, the second face of the metal frame is shaped, at its at least two sides facing each other out of four sides thereof, so as to be warped concavely toward the metal lid as viewed in vertical cross section, and the maximum warpage of the second face of the metal frame at each of the at least two sides is equal to or less than 0.2% of the length of the side of the second face.

Unlike a conventional package including a metal frame whose face (second face) on the metal-lid side is completely flat, the metal frame of the package of this invention has the second face thereof formed into a concave shape at its at least two facing sides. In other words, out of four wall portions that form the metal frame, at least two facing wall portions have metal-lid side faces that are formed into a concave shape. When the metal lid is brought in close contact with the metal frame, peripheral edge portions of the metal lid are slightly curved along the concave face of the metal frame. Hence, such a restoration force is generated in the peripheral edge portions of the metal lid as to restore the edge portions into an original straight shape, so that corner portions of the metal lid act to press the metal frame. In other words, at each corner of the package, the degree of close contact between the metal frame and the metal lid is enhanced. On the other hand, at the middle of adjacent corners of the metal lid (i.e., a central portion of a respective side (i.e., a respective peripheral edge) of the metal lid), the restoration force causes the metal lid to separate away from the concave face of the metal frame, incurring a possibility that the degree of close contact therebetween is lowered. In this invention, the maximum warpage of the concave face of the metal frame is limited to be equal to or less than 0.2% of the length of the concave side (i.e., concave face) of the metal frame, thereby preventing a reduction in the degree of contact between the metal lid and the metal frame at respective corners of the package. This makes it possible to enhance the degree of close contact between the metal lid and the metal frame at respective corners, while maintaining the metal lid and the metal frame in close contact with each other at the middle of adjacent corners of the package. Thus, welding conditions are stabilized along the entire periphery of the metal lid and the metal frame, whereby faulty welding can be reduced without the need of increasing an amount of power supply in seam welding.

According to another aspect of the present invention, there is provided a semiconductor device package comprised of a metal base having a placement section on which a semiconductor device is placed; a metal frame having a rectangular shape in transverse cross section and having a first face thereof joined to the metal base; a seal ring having a first face thereof joined to a second face of the metal frame; and a metal lid joined to a second face of the seal ring. In the semiconductor device package, the second face of the seal ring is shaped, at its at least two sides facing each other out of four sides thereof, so as to be warped concavely toward the metal lid as viewed in vertical cross section, and the maximum warpage of the second face of the seal ring at each of the at least two sides is equal to or less than 0.2% of the length of the side of the second face.

In this semiconductor device package, when the metal lid is brought in close contact with the seal ring, peripheral edge portions of the metal lid are slightly curved along the concave face of the seal ring, so that corner portions of the metal lid act to press the seal ring. Further, the maximum warpage at a respective side of the concave face of the seal ring is limited to a value not more than 0.2% of the length of the side, so that the metal lid and the seal ring are brought in close contact with each other over the entire periphery thereof, to thereby enhance the degree of close contact therebetween at respective corners of the package. As a result, welding conditions are stabilized along the entire periphery of the metal lid and the seal ring, whereby faulty welding can be reduced without the need of increasing an amount of power supply in seam welding.

DETAILED DESCRIPTION

With reference to the drawings, a semiconductor device package according to an embodiment of this invention will be explained hereinbelow.

Figure 1:
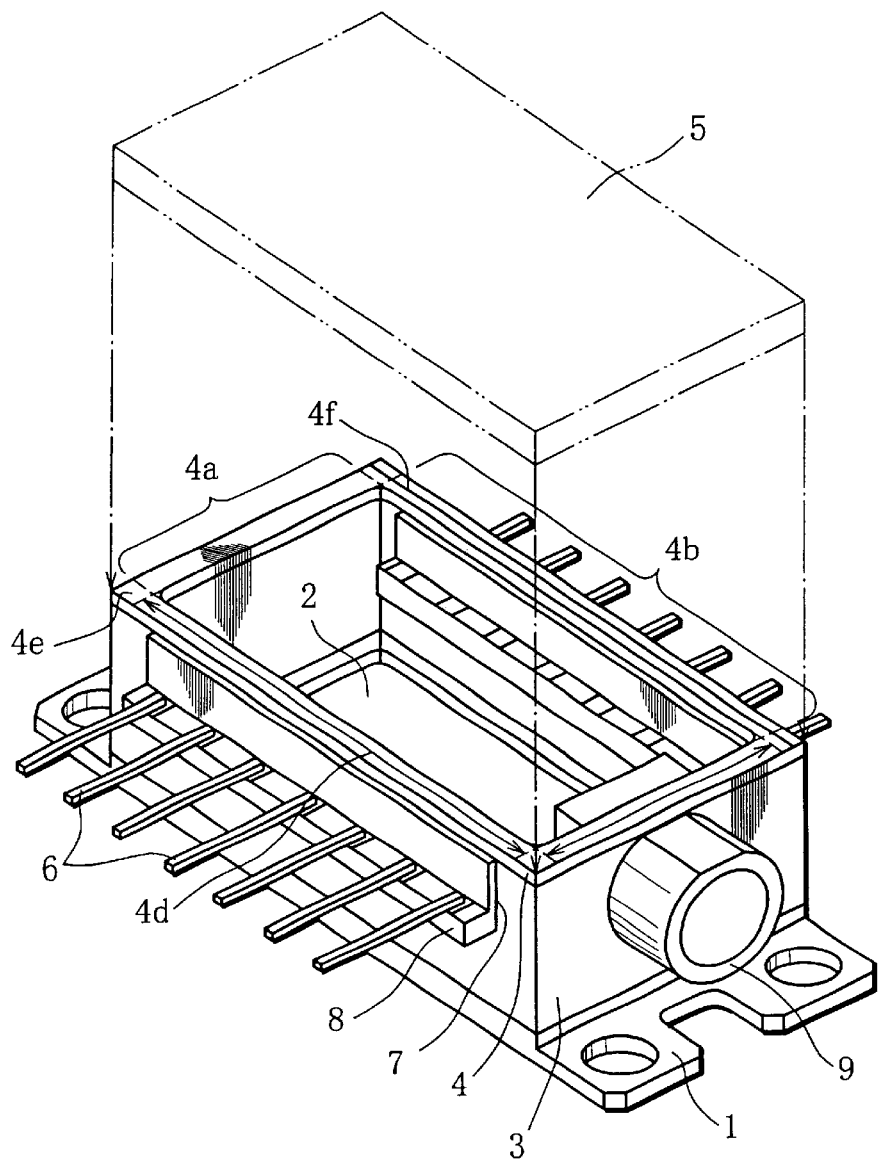
FIG. 1 is a schematic perspective view of a semiconductor device package according to an embodiment of this invention.

As shown in FIG. 1, the semiconductor device package of this embodiment is comprised of a metal base 1 provided at a central part of its upper face with a placement section 2 on which a semiconductor device or a semiconductor-device mounting board (none of which is shown) is placed, and a metal frame 3 joined at its lower face (first face) to a peripheral portion of an upper face of the metal base 1. A seal ring 4 is joined at its lower face (first face) to an upper face (second face) of the metal frame 3, and a metal lid 5 is joined to an upper face (second face) of the seal ring 4.

The metal base 1 is made from a material, such as a Cu-W alloy, having a thermal expansion coefficient close to that of a semiconductor device or a ceramic substrate for mounting a semiconductor device and having high thermal conductivity, so as to immediately dissipate heat generated by the semiconductor device which is in use and suppress the generation of thermal stress therein. The metal frame 3 is made from a material, such as an Fe-Ni alloy or an Fe-Ni-Co alloy, having a thermal expansion coefficient close to that of the metal base 1, thereby suppressing heat stress. The seal ring 4 and the metal lid 5 are constituted by materials of the same kind as that of the metal frame 3.

Figure 3:
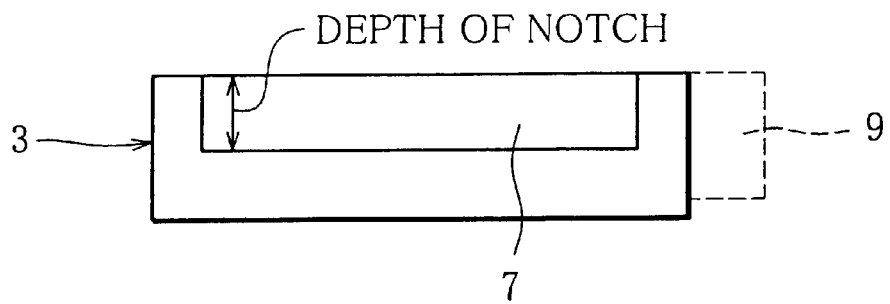
FIG. 3 is a schematic front view of a metal frame of the semiconductor device package shown in FIG. 1.

The metal frame 3 has front, rear, right and left wall portions which are integral to one another, and is formed into a rectangular shape in transverse cross section as a whole. The front and rear wall portions of the metal frame 3 are formed with notches 7 (FIG. 3), respectively, to which electrical signal input/output portions 8 made of a ceramic material are joined. Leads 6 are supported by the signal input/output portions 8. These leads 6 are connected at their inner ends with lead terminals (not shown) of a semiconductor device received in the package, respectively, and drawn out to the outside through the metal frame 3. A window frame 9 is joined to the right wall portion of the frame 3, and optical signal lines (not shown) connected to optical signal output terminal (not shown) of an optical semiconductor device, if such a device is received in the package, are drawn out to the outside through a window (not shown) made of glass or sapphire and joined to the window frame 9. The seal ring 4 is comprised of four seal ring portions that are integral with one another.

Figure 4:
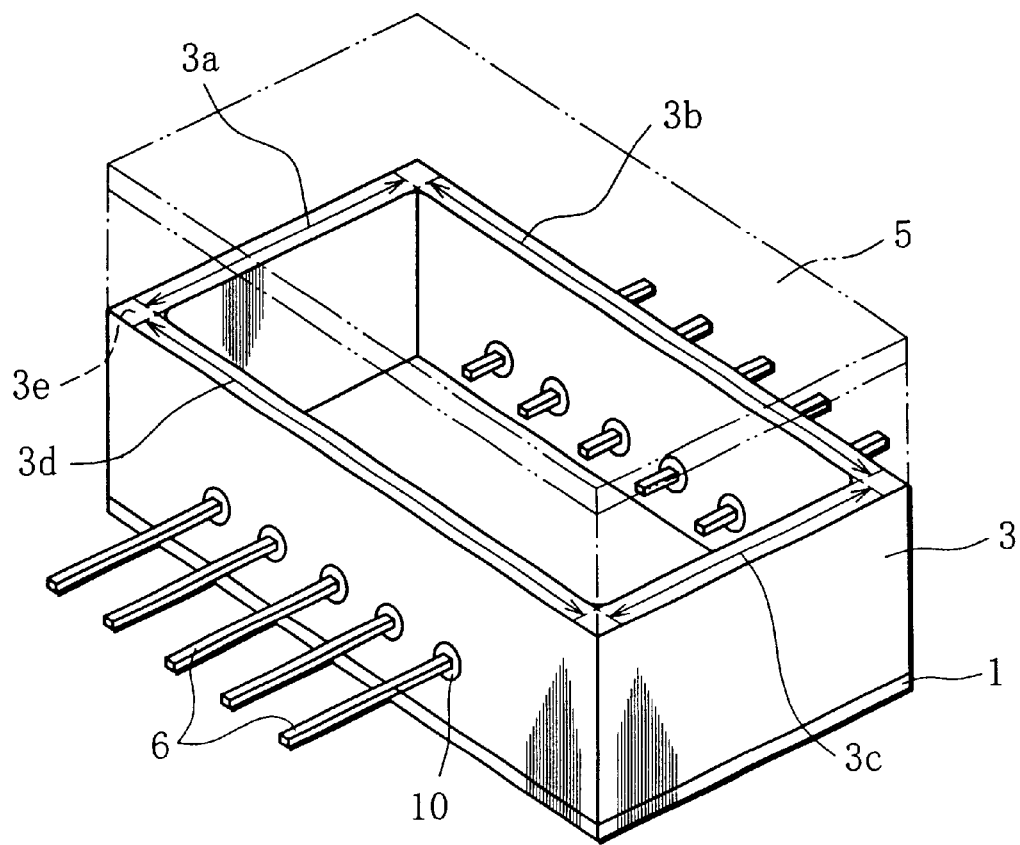
FIG. 4 is a schematic perspective view of a semiconductor device package according to another embodiment of this invention.

As described in the above, in order to hermetically seal a semiconductor device within the package, the metal lid 5 must be seam-welded to the seal ring 4 after the semiconductor device is accommodated in a package housing comprised of the metal base 1, metal frame 3 and seal ring 4 that are silver-brazed to one another. In the case of a package not provided with a seal ring as shown in FIG. 4, the metal lid 5 is seam-welded to the metal frame 3. In FIG. 4, reference numeral 10 denotes a glass seal portion for hermetically sealing the leads 6 at insertion holes of the metal frame 6 through which the leads pass.

In the seam welding, faulty welding is liable to occur at four corners (indicated by reference numerals 4e and 3e in FIGS. 1 and 4) of the package, and a misalignment of a semiconductor device is likely caused due to influences of welding heat thereon, if an amount of power supply to roller electrodes is increased to reduce occurrences of faulty welding.

The package of this embodiment is designed to reduce faulty welding without the need of increasing the amount of power supply. More specifically, in the package of this embodiment, an upper face of the metal frame 3 or the seal ring 4 is shaped, at its at least two facing sides out of four sides thereof, so as to be warped concavely toward the metal lid 5 as viewed in vertical cross section. In other words, upper faces of at least two facing wall portions out of the four wall portions of the metal frame 3 are formed into a concave shape. Alternatively, upper faces of at least two facing seal ring portions out of the four seal ring portions of the seal ring 4 are formed into a concave shape. In FIG. 4, the four sides of the upper face (i.e., the upper faces of the front, rear, left and right wall portions) of the metal frame 3 are shown by reference numerals 3a–3d. In FIG. 1, the four sides of the upper face (i.e., the upper faces of the four seal ring portions) of the seal ring 4 are shown by reference numerals 4a–4d, respectively.

Figure 2:
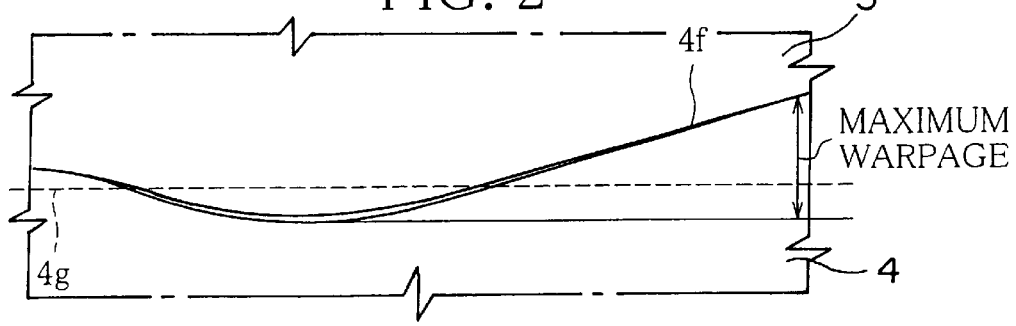
FIG. 2 is a view depicting, with emphasis, concave warpage of an upper face of a seal ring of the semiconductor device package shown in FIG. 1.

Since the warpage of the upper faces of the frame wall portion or the seal ring portion is difficult to visualize in FIGS. 1 and 4, FIG. 2 depicts the warpage of the upper face of the seal ring 4 in an exaggerated manner for illustrative purposes.

As shown in FIG. 2 with emphasis, the upper face of the frame wall portion (or the seal ring portion) is formed into a circular arc shape which is concave upward as viewed in a vertical sectional plane passing through a widthwise center line of the upper face. In other words, the vertical position of the concave upper face of the wall portion (or the seal ring portion) is low at a lengthwise central part of the wall portion (or the seal ring portion) and high at both end sides thereof.

Reference numeral 4f in FIGS. 1 and 2 denotes a line at which the concave upper face of the frame wall portion (or the seal ring portion) intersects with an imaginary vertical plane passing through the widthwise center line of the concave upper face. Dotted line 4g in FIG. 2 indicates an average height of the wall portion or the seal ring portion having such a concave upper face. The maximum warpage of the concave upper face is represented by the difference between the maximum and minimum vertical positions of the concave upper face of the wall portion or the seal ring portion. The maximum and minimum vertical positions are determined in a condition that the average vertical position of the wall portion or the seal ring portion is positioned horizontally as shown by the dotted line 4g in FIG. 2. In the present embodiment, the concave upper face of the frame wall portion or the seal ring portion is formed such that the maximum warpage is equal to or less than 0.2% of the length of the wall portion or the seal ring portion.

In this invention, the shape of the concave warpage of the upper face of the metal frame 3 or the seal ring portion 4 is not limited to a particular one, however, the metal frame 3 or the seal ring 4 is preferably shaped such that the vertical position of the upper face decreases to its minimum at a central part of the side edge of the upper face. When the upper face is formed into such a shape, a uniform welding width can be attained in seam welding the metal lid 5 to the metal frame 3 or the seal ring 4.

In order to form the upper face of the metal frame 3 or the seal ring 4 into a concave shape, the upper face of the metal frame 3 or the seal ring 4 can be pressed by means of a press machine provided with a press die formed into a convex shape complementary to the concave upper face of the metal frame 3 or the seal ring 4, for instance. Alternatively, the depth of the notch 7 formed in the metal frame 3 is made slightly larger, at its lengthwise central part, than the height of the electrical signal input/output portion 8 to be joined to the notch 7.

When the metal lid 5 is brought in close contact with the upper face of the seal ring 4 or the metal frame 3 prior to the start of seal welding, lid portions disposed in close contact with the concave upper face of the seal ring portion or the frame wall portion is curved therealong so as to be concaved upward. Thus, the lid portions are slightly deformed and attempt to return to their original straight shape. A restoration force produced in the metal lid 5 acts as downward pressing force onto the lengthwise end portions of the seal ring portions or the frame wall portions (that is, corners of the package), to cause the metal lid 5 to be in close contact with the seal ring 4 or the metal frame 3 at respective corners. In this manner, at the corners, a force acting to cause the seal ring 4 or the metal frame 3 and the metal lid 5 to press against each other is produced therebetween, and thus welding conditions at the corners in the seam welding are stabilized. As a result, faulty welding and accordingly leak failure can be reduced without the need of increasing the amount of power supply to roller electrodes than usual in the seam welding. Furthermore, occurrences of crack at respective corners are suppressed because seam welding at the corners of the package is carried out in a stable manner. In addition, since the seal ring 4 or the metal frame 3 and the metal lid 5 are in close contact with each other at the corners, a crack is prevented from propagating, if such a crack is produce at a corner, making it possible to reduce a fear to produce a large crack leading to leakage fault. Furthermore, the seam welding can be carried out properly with an ordinary amount of power supply, thereby reducing welding heat and accordingly a fear of misalignment of a semiconductor device in the package which would be otherwise caused by affections of welding heat.

As apparent from the foregoing explanation, the upper face of the metal frame 3 or the seal ring 4 is preferably formed at its four sides into a concave shape in order to stabilize welding conditions at four corners of the package. On the other hand, if the metal frame 3 or the seal ring 4 has the upper face thereof formed only at its one side or two adjacent sides into a concave shape, two corners or one corner of the package cannot enjoy the effect of the concavely formed side such as to enhance the degree of close contact between the metal frame 3 or the seal ring 4 and the metal lid 5. As a result, at the just-mentioned one or two corners, the frame 3 or the seal ring 4 is not sufficiently kept in close contact with the lid 5, causing unstable welding conditions. For this reason, in the present invention, the upper face of the metal frame 3 or the seal ring 4 is formed into a concave shape at at least two sides facing each other.

If the maximum warpage of the concave upper face of the ring or the frame is excessively large, then the metal lid 5 disposed on the upper face and slightly deformed is liable to separate away from the seal ring 4 or the metal frame 3 at a portion corresponding to a central warpmost part of a relevant side of the upper face, attributable to a restoring force produced in the deformed metal lid 5 and causing the same to return to an original straight shape. Thus, the degree of close contact of the lid 5 with the seal ring 4 or the frame 3 is lowered, causing faulty welding. Based on experiments, the present inventors confirmed that such faulty welding due to degraded contact of the central part of the side of the lid 5 with the seal ring 4 or the frame 3 is liable to occur when the warpage of the upper concave face of a corresponding seal ring portion of the seal ring 4 or a corresponding wall portion of the frame 3 exceeds 0.2% of the length of the seal ring portion or the wall portion. In this embodiment, the maximum warpage of the upper concave face of a seal ring portion or a frame wall portion is limited to not more than 0.2% of the length of the seal ring portion or the wall portion, thereby securely preventing faulty welding attributable to degraded close contact of a central part of a respective side of the lid 5 with the seal ring 4 or the frame 3.

EXAMPLE 1

In Example 1, packages each having a structure shown in FIG. 4 were fabricated. First, a metal base 1 made of a Cu-W alloy and having 30 mm length, 15 mm width, and 0.8 mm thickness was prepared. Then, a metal frame 3 was joined to the metal base 1 by means of silver brazing, leads 6 joined to the frame 3 were sealed with glass seals 10, and the entire face of the frame 3 was plated with Ni and Au in this order. Furthermore, concave warpage is formed at two to four sides of an upper face of the frame 3 by applying the upper face of the frame 3 with use of a press machine (not shown) having a press die which is a convex shape complementary to concave warpage to be formed in the upper face of the frame 3. The maximum warpage on each side was equal to 0.1% or 0.2% of the length of the side. Then, the metal frame 3 was microparallel-seam-welded to metal lid 5 placed on the upper face of the frame 3 with an ordinary amount of power supply.

More specifically, in Example 1, four types of packages individually numbered "1" through "4" in Table 1 were fabricated, which were different from one another in maximum warpage and in number of sides formed with a concave warp. Packages corresponding to number "1" had their metal bases each having an upper face thereof formed at two long sides with a concave warp whose maximum warpage is equal to 0.1% of the length of the long side. As for packages corresponding to number "2," a concave warp was formed at two long sides of an upper face of the metal base, with the maximum warpage equal to 0.2% of the length of the long side. For packages corresponding to number "3," an upper face of the metal base was formed at two long sides and one short side with a concave warp whose maximum warpage was equal to 0.1% of the length of the side concerned. For package corresponding to number "4," a concave warp was formed at four sides of an upper face of the metal base, with the maximum warpage equal to 0.2% of the length of the side concerned.

COMPARATIVE EXAMPLE 1

Packages were fabricated in the same manner as those of Example 1 numbered "1" in Table 1 except that the maximum warpage was equal to 0.3% of the length of a respective side.

COMPARATIVE EXAMPLE 2

Packages were fabricated in the same manner as those of Example 1 numbered "2" in Table 1 except that a concave warp was formed only at one side (long side) of an upper face of the metal frame 3.

COMPARATIVE EXAMPLE 3

Packages were fabricated in the same manner as those of Example 1 numbered "1" through "4" in Table 1 except that no concave warp was formed in an upper face of the metal frame 3.

COMPARATIVE EXAMPLE 4

Packages were fabricated in the same manner as those of Comparative Example 3 except that the amount of power supply was 1.5 times an ordinary amount.

TABLE 1

| | Number | Number of sides formed with warpage | Amount of power supply | Maximum warpage | Rate of leakage (%) | Temperature rise at upper face of base |
|---|---|---|---|---|---|---|
| Example 1 | 1 | 2 | 1.0 | 0.1 | 0 | ○ |
| | 2 | 2 | 1.0 | 0.2 | 0 | ○ |
| | 3 | 3 | 1.0 | 0.1 | 0 | ○ |
| | 4 | 4 | 1.0 | 0.2 | 0 | ○ |
| Comparative example 1 | 5 | 2 | 1.0 | 0.3 | 11 | ○ |
| Comparative example 2 | 6 | 1 | 1.0 | 0.2 | 18 | ○ |
| Comparative example 3 | 7 | 0 | 1.0 | — | 21 | Δ |
| Comparative example 4 | 8 | 0 | 1.5 | — | 2 | X |

Performance tests on packages of Example 1 and Comparative Examples 1–4:

In respect of 100 packages corresponding to each of the first to fourth types of Example 1 and Comparative Examples 1–4, a temperature rise at an upper face of the metal base 1 during the seam welding was measured. Further, in respect of 800 packages in total, the presence/absence of leakage was tested with use of a He leak tester.

Results of the measurements and tests are shown in Table 1 in which the amount of power supply is represented by a multiple of an ordinary power supply amount. As for the temperature rise at the upper face of the metal base, marks ○, Δ, and X indicate cases where the temperature rise was less than, larger than, and extremely larger than an allowable value, respectively.

As apparent from Table 1, the packages of the four types of Example 1 are free from leakage and a temperature rise less than the allowable value is observed at upper faces of their metal bases when they are subjected to seam welding.

On the contrary, leakage occurs in 11 packages out of the 100 packages of Comparative Example 1 for the reasons that the maximum warpage is excessively large, so that faulty welding occurs on the side to which the concave warp is formed. Out of the 100 packages of Comparative Example 2, leakage occurs in 18 packages because the concave warp is formed only at respective one side of upper faces of their metal bases, causing faulty welding at corners of these packages. As for the 100 packages of Comparative Example 3, twenty-one packages entail leakage and a temperature rise exceeding the allowable value is measured at upper faces of the metal bases during the seam welding, because no concave warp is formed in upper faces of the metal bases and faulty welding occurs at corners of the packages. Further, two packages out of the 100 packages of Comparative Example 4 entail leakage, and a temperature rise extremely larger than the allowable value is measured at upper faces of metal bases of the packages. That is, such an excessive temperature rise is caused because no concave warp is formed in upper faces of the metal bases, although the rate of occurrences of leakage is decreased by making the amount of power supply larger to the extent that it is 1.5 times as large as an ordinary power supply amount.

EXAMPLE 2

In Example 2, packages each having a structure shown in FIG. 1 were fabricated. First, metal bases 1 made of a Cu-W alloy and having 30 mm length, 13 mm width, and 1.5 mm thickness were prepared, and metal frames 3 made of covar (an Fe—29 wt % Ni—17 wt % C alloy) and having 20 mm length, 13 mm width, 6 mm height, and 1 mm thickness were prepared. Further, seal rings 4 of covar and electrical signal input/output portions 8 of alumina were prepared. Upon fabrication of the metal frame 3, a notch 7 was formed in the metal frame 3 such that, at a lengthwise central part of the notch, the depth of the notch 7 was made slightly larger than the height of the electrical signal input/output portion 8. Then, the metal frame 3 was joined to an upper face of the metal base 1, the electrical signal input/output portion 8 was joined to the notch 7 of the frame 3, a window frame 9 was joined to the right wall portion of the frame 3, and the seal ring 4 was joined to an upper face of the frame 3, whereby a housing of each package was fabricated. The aforesaid various parts of the housing were subject to silver brazing so as to be joined to one another at a time. Next, the housing was plated with Ni and Au in this order. Thereafter, a glass window was hermetically attached to the window frame 9 with use of a low melting-point glass, and the metal lid 5 was seam-welded to an upper face of the seal ring 4 with an amount of power supply which was 80% as large as an ordinary power supply amount, thereby completing the package. In the package, since the depth of the notch 7 of the metal frame 3 was made larger, toward a lengthwise central part of the notch, than the height of the electrical signal input/output portion 8, the upper face of the seal ring 4 joined to the notch 7 was warped concavely. The warpage of the upper face of the seal ring 4 was measured by a contactless type warpage tester.

More specifically, in Example 2, three types of packages individually numbered "11" through "13" in Table 2 were fabricated, which were different from one another in maximum warpage or in number of sides formed with a concave warp. Packages corresponding to number "11" had their metal bases each having an upper face thereof formed at two long sides with a concave warp whose maximum warpage is equal to 0.1% of the length of the long side. As for packages corresponding to number "12," a concave warp was formed at two long sides of an upper face of the metal base, with the maximum warpage equal to 0.2% of the length of the long side. For packages corresponding to number "13," a concave warp was formed at four sides of an upper face of the metal base, with the maximum warpage equal to 0.2 of the length of the side concerned.

COMPARATIVE EXAMPLE 5

Packages were fabricated in the same manner as those of Example 2 numbered "11" in Table 2 except that the maximum warpage was equal to 0.3% of the length of a respective side.

COMPARATIVE EXAMPLE 6

Packages were fabricated in the same manner as those of Example 2 numbered "12" in Table 2 except that a concave warp was formed only at one side (long side) of an upper face of the metal frame 3.

COMPARATIVE EXAMPLE 7

Packages were fabricated in the same manner as those of Example 2 numbered "11" through "13" in Table 2 except that no concave warp was formed in an upper face of the metal frame 3.

COMPARATIVE EXAMPLE 8

Packages were fabricated in the same manner as those of Comparative Example 7 except that an ordinary amount of power supply was used.

TABLE 2

| | Number | Number of sides formed with warpage | Amount of power supply | Maximum warpage | Rate of leakage (%) | Temperature rise at upper face of base |
|---|---|---|---|---|---|---|
| Example 2 | 11 | 2 | 0.8 | 0.1 | 0 | ○ |
| | 12 | 2 | 0.8 | 0.2 | 0 | ○ |
| | 13 | 4 | 0.8 | 0.2 | 0 | ○ |
| Comparative example 5 | 14 | 2 | 0.8 | 0.3 | 14 | ○ |
| Comparative example 6 | 15 | 1 | 0.8 | 0.2 | 7 | ○ |
| Comparative example 7 | 16 | 0 | 0.8 | — | 10 | x |
| Comparative example 8 | 17 | 0 | 1.0 | — | 5 | ○ |

Performance tests on packages of Example 2 and Comparative Examples 5–8:

In respect of 100 packages corresponding to each of the first to third types of Example 2 and Comparative Examples 5–8, a temperature rise at an upper face of the metal base 1 during the seam welding was measured. Further, in respect of 700 packages in total, the presence/absence of leakage was tested with use of a He leak tester. Results of the measurements and tests are shown in Table 2 in which the amount of power supply is represented by a multiple of an ordinary power supply amount. As for the temperature rise at the upper face of the metal base, marks ○ and X indicate cases where the temperature rise was less than and extremely larger than an allowable value, respectively.

As apparent from Table 2, the packages of the three types of Example 2 are free from leakage and a temperature rise less than the allowable value is measured at upper faces of the metal bases when they are subjected to seam welding, although the power supply amount for the seam welding was made smaller than usual.

On the contrary, leakage occurs in 14 packages out of the 100 packages of Comparative Example 5 because the maximum warpage is excessively large, so that faulty welding occurs on the side to which the concave warp is formed. Out of the 100 packages of Comparative Example 6, leakage occurs in seven packages because the concave warp is formed only at one side of upper faces of the metal bases, causing faulty welding at corners of the packages. As for the 100 packages of Comparative Example 7, ten packages entail leakage and a temperature rise measured at upper faces of the metal bases during the seam welding is excessively larger than the allowable value because metal bases have upper faces thereof formed with no concave warp and faulty welding occurs at corners of packages. Five packages out of the 100 packages of Comparative Example 8 entail leakage. This indicates that leakage may occur in a case where no concave warp is formed in the upper face of the metal base even if seam welding is carried out with an ordinary amount of power supply.

The present invention is not limited to the foregoing embodiment and Examples 1 and 2, but may be modified variously within the scope of this invention as defined in the claims.

What is claimed is:

1. A semiconductor device package, comprising:
   a metal base having a placement section configured to hold a semiconductor device;
   a metal frame having a rectangular shape in transverse cross section and having a first face joined to the metal base and a second face; and
   a metal lid seam-welded to the second face, wherein
      the second face comprises a warp configured concavely on at least two opposite sides of the second face toward the lid, and
      said warp comprises a maximum warpage larger than 0.0% and not larger than 0.2% of a length of one of the at least two opposite sides containing said warp, said maximum warpage positioned at a lengthwise central part of said warp.

2. The semiconductor device package according to claim 1, wherein the maximum warpage is equal to or larger than 0.1% of the length of the side concerned of the second face of the metal frame.

3. The semiconductor device package according to claim 1, wherein
   the metal frame is plated with a material having a melting temperature lower than that of a constituent material of the metal frame.

4. The semiconductor device package according to claim 1, wherein said metal lid is configured to supply a restoration force so as to increase weld quality.

5. A semiconductor device package, comprising:
   a metal base having a placement section configured to hold a semiconductor device;

a metal frame having a rectangular shape in transverse cross section and having a first face thereof joined to the metal base and a second face;

a seal ring having a first face and a second face, the first face of the seal ring being joined to the second face of the metal frame; and a metal lid seam-welded to the second face of the seal ring, wherein the second face of the seal ring comprises a warp configured concavely on at least two opposite sides of the second face of the seal ring toward the lid, and said warp comprises a maximum warpage between 0.1% and 0.2%, inclusive, of a length of one of the at least two opposite sides containing said warp, said maximum warpage positioned at a lengthwise central part of said warp.

6. The semiconductor device package according to claim 5, wherein the maximum warpage is equal to or larger than 0.1% of the length of the side concerned of the second face of the seal ring.

7. The semiconductor device package according to claim 5, wherein the seal ring is plated with a material having a melting temperature lower than that of a constituent material of the seal ring.

8. The semiconductor device package according to claim 5, wherein said metal lid is configured to supply a restoration force so as to increase weld quality.

9. A method for manufacturing a semiconductor device package, comprising the steps of:

joining a first face of a metal frame having a rectangular shape in transverse cross section to a metal base having a placement section configured to hold a semiconductor device; and seam-welding a metal lid to a second face of the metal frame, said metal frame configured to provide a restoration force while seam-welding so as to increase weld quality, wherein the second face comprises a warp configured concavely on at least two opposite sides of the second face toward the lid, and said warp comprises a maximum warpage larger than 0.0% and not larger than 0.2% of a length of one of the at least two opposite sides containing said warp, said maximum warpage positioned at a lengthwise central part of said warp.

10. The method for manufacturing a semiconductor device package, according to claim 9, wherein said metal frame comprises a plate comprising Ni and Au.

11. A method for manufacturing a semiconductor device package, comprising the steps of:

joining a first face of a metal frame having a rectangular shape in transverse cross section to a metal base having a placement section configured to hold a semiconductor device;

joining a first face of a seal ring to a second face of the metal frame; and seam-welding a metal lid to a second face of the seal ring, said metal frame configured to provide a restoration force while seam-welding so as to increase weld quality, wherein the second face of the seal ring comprises a warp configured concavely on at least two opposite sides of the second face of the seal ring toward the lid, and said warp comprises a maximum warpage larger than 0.0% and not larger than 0.2% of a length of one of the at least two opposite sides containing said warp, said maximum warpage positioned at a lengthwise central part of said warp.

12. The method for manufacturing a semiconductor device package, according to claim 11, wherein said metal frame comprises a plate comprising Ni and Au.

* * * * *